United States Patent [19]
Mori et al.

[11] Patent Number: 5,442,229
[45] Date of Patent: Aug. 15, 1995

[54] METAL LEAD-FILM CARRIER ASSEMBLY HAVING A PLURALITY OF FILM CARRIERS, AND FILM CARRIER-SEMICONDUCTOR CHIP ASSEMBLY AND SEMICONDUCTOR DEVICE CONTAINING SUCH METAL LEAD-FILM CARRIER ASSEMBLY

[75] Inventors: Takao Mori, Kanagawa; Satoshi Yoshida, Hachioji; Tadahiko Nishimukai, Sagamihara; Kenji Yamaguchi, Hitachi, all of Japan

[73] Assignees: Hitachi, Ltd.; Hitachi Cable, Ltd., both of Tokyo, Japan

[21] Appl. No.: 118,646

[22] Filed: Sep. 10, 1993

[30] Foreign Application Priority Data

Sep. 10, 1992 [JP] Japan .................................. 4-241717

[51] Int. Cl.6 ............... H01L 23/48; H01L 29/44; H01L 29/52; H01L 29/60
[52] U.S. Cl. ............................ 257/666; 257/671; 257/668
[58] Field of Search ................... 257/668, 666, 671

[56] References Cited

U.S. PATENT DOCUMENTS 5,173,763 12/1992 Cipolla et al. ................. 257/668

Primary Examiner—Sara W. Crane
Assistant Examiner—S. V. Clark
Attorney, Agent, or Firm—Antonelli, Terry, Stout & Kraus

[57] ABSTRACT

A method of assembling a semiconductor chip on a tape carrier has the steps of stacking, on a film carrier having a first group of metal leads, another film carrier having a second group of metal leads and bonding the two film carriers together by adhesive to form a laminated structure. The first and second groups of metal leads are so disposed that they do not contact and do not cross one another. The tips of the metal leads of the two groups are bonded to the electrodes on the semiconductor chip. The metal leads are formed in advance on the corresponding film carriers by etching. By stacking the plurality of film carriers, the connection pitch can be reduced while eliminating a necessity for reducing the thickness of each lead.

13 Claims, 15 Drawing Sheets

FIG. IA
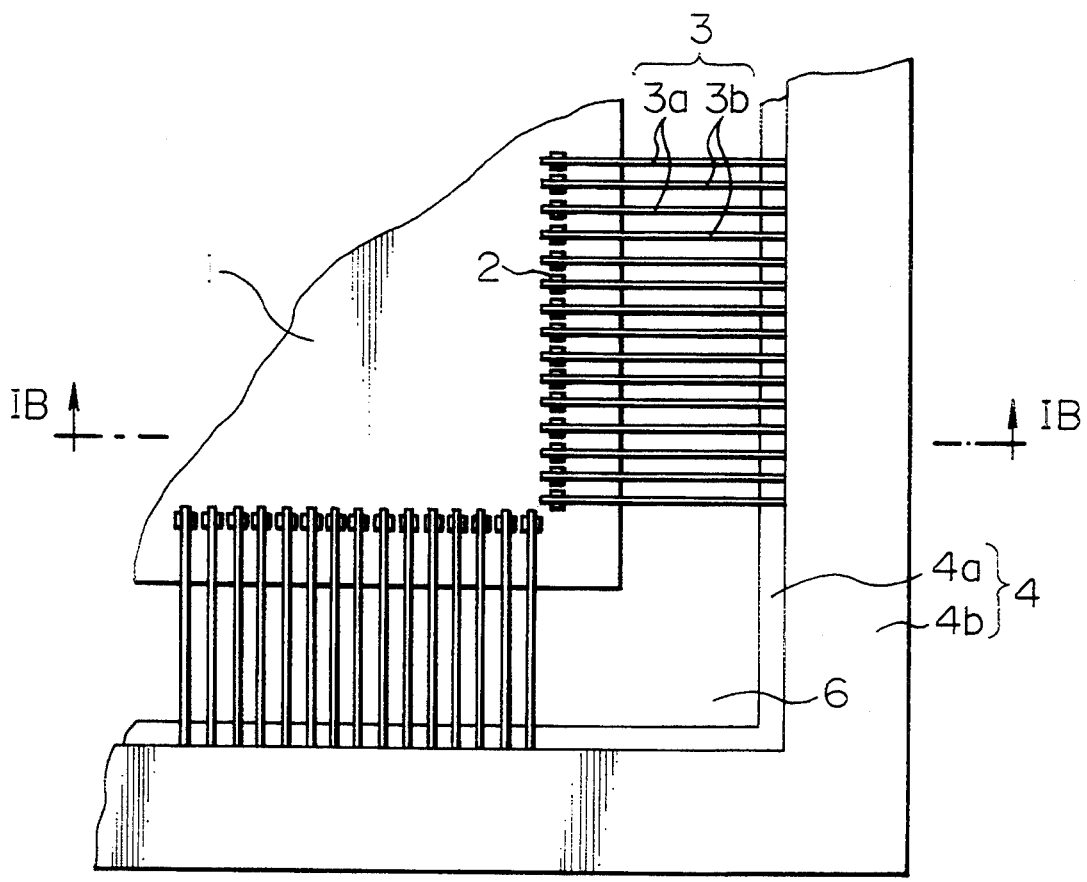
FIG. IB
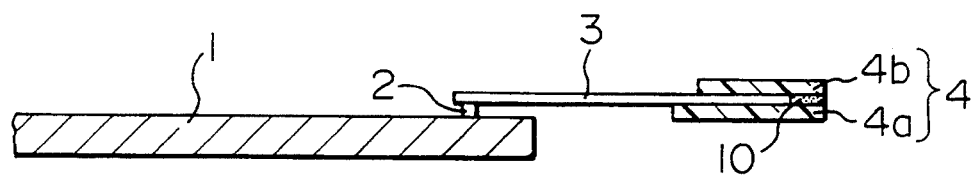

METAL LEAD-FILM CARRIER ASSEMBLY HAVING A PLURALITY OF FILM CARRIERS, AND FILM CARRIER-SEMICONDUCTOR CHIP ASSEMBLY AND SEMICONDUCTOR DEVICE CONTAINING SUCH METAL LEAD-FILM CARRIER ASSEMBLY

BACKGROUND OF THE INVENTION

1. Field of the Invention

The present invention relates to an assembly composed of metal leads and a film carrier for use to establish electrical connections between a semiconductor chip and another electric element, an assembly composed of a film carrier and a semiconductor chip, a method of manufacturing the same, a semiconductor device using the assembly composed of the metal leads and the film carrier and a method of manufacturing the same.

2. Description of the Prior Art

Electronic equipment ranging from a handy calculator to a large-scale computer developed recently uses a semiconductor chip employing tape-carrier joining for improving the performance and miniaturization. A schematic structure of tape-carrier joining for use in the foregoing semiconductor device is shown in FIG. 13.

Referring to FIG. 13, a semiconductor chip 101 is connected to a plurality of fine metal leads 103 disposed on a polyimide film carrier 104. The method of assembling the semiconductor chip is called a TAB (Tape Automated Bonding) method. Since the TAB assembling method is a method in which mounting of the semiconductor chip 101 on the tape carrier 104 and joining (inner-lead-bonding) of the metal leads 103 are performed completely automatically, this method exhibits an excellent mass-productivity. The metal leads 103, the inner leads of which have been bonded, and which are placed on the film carrier 104, are cut to have predetermined lengths so that outer leads are formed. Then, the outer leads are subjected to a forming process so as to be adaptable to the state where the semiconductor chip 101 is assembled. Then, the semiconductor chip 101 is, as shown in FIGS. 14A and 14B, mounted on a wiring board 112, and the outer leads are connected (outer-lead-bonding). FIG. 14A shows an ordinary example of an assembled structure in which the reverse side of the semiconductor chip 101 is die-bonded to electrodes 111 of the substrate 112. If heat radiation from the reverse side of the semiconductor chip 101 must be enhanced, a structure as shown in FIG. 14B is employed in which the semiconductor chip 101 is bonded in a face-down manner. In the foregoing assembling methods, the facility of putting together the fine metal leads 103 on the semiconductor chip 101 and the wiring board 112 is improved by, as shown in FIG. 13, enlarging the pitch of the metal leads 103 in the periphery of a device-hole 106 to about three to five times the pitch of the metal leads 103 in the portions in which the connections between the semiconductor chip 101 and the metal leads 103 are established.

An increase in the number of pins resulted from the fact that the semiconductor chip has been highly integrated arises trends that the metal leads on the tape-carrier are fined and that the pitch of the metal leads is made narrow. Therefore, a method has been employed in which the metal leads on a single film are fined, the metal leads are disposed in a multi-layer and the tape-carriers are stacked up so that the number of the bonding leads is increased.

Technologies relating to a semiconductor device of the foregoing type have been disclosed in, for example, Japanese Patent Unexamination Pubication No. 63-62335, Japanese Patent Unexamination Pubication No. 63-164229, Japanese Patent Unexamination Pubication No. 64-19737 and Japanese Patent Unexamination Pubication No. 1-106438.

The foregoing conventional technologies have not been made to satisfactorily form electrodes-required to connect tape-carriers which have been previously stacked up on a semiconductor chip. That is, the tips of groups of metal leads projecting from stacked film carriers form steps that correspond to the number of the stacked layers. In order to perform a bonding uniformly, the heights of the electrodes on the semiconductor chip must be the same as the heights of the metal leads. It has been very difficult to simultaneously form electrodes having different heights on a single semiconductor chip. If the film carrier and the metal leads are thinned to reduce the vertical level difference of the electrodes, the metal leads can easily be etched and appreciation of pins by narrowing the lead pitch can be realized. However, there arises a problem that the metal leads of this type cannot be adapted to assembling of a semiconductor chip in which signals must be transmitted at a high speed. The reason for this is that parasitic capacitance, such as the resistance or the self-inductance or the like of the lead is increased due to narrowing of the widths of the leads caused by the reduction in the lead pitch and due to the reduction in the lead thickness, causing the signal transmission speed to be lowered and crosstalk-noise to be increased.

In the conventional TAB assembling method, a semiconductor chip is bonded on to a tape-carrier and, then, the outer leads are cut and formed into predetermined shapes. Then, the semiconductor chip is mounted on a printed-wiring-board or a ceramic-wiring-substrate. Therefore, the appreciation of pins of the tape carrier and fining of the leads raise problems that adjustment of the positions of the leads is difficult at the time of assembling the substrate on the tape carrier and the bonding process cannot easily be performed. The problems are due to the fact that fining of the leads causes the mechanical strength of the leads to be weakened and, accordingly, the leads are easily deformed even if a small external force is applied. That is, the state of the conventional TAB assembling method where the tips of the cut leads project from the tape carrier causes a bend of a part of the leads and local pitch deviation to take place during the process of forming the leads, the process of adjusting the position of the substrate and the bonding process, resulting in difficulty to handle the elements at the time of assembling the elements.

As described above, the process of assembling a highly integrated and high-speed-operative semiconductor chip on a tape carrier must be performed by selecting the shapes of the leads and maintaining the assembling facility such that the appreciation of pins of the metal leads is realized and the high-speed operation of the device is maintained.

SUMMARY OF THE INVENTION

Accordingly, an object of the present invention is to provide a metal lead-film carrier assembly which is effective to carry out a tape-mounting of a semiconductor chip having many terminals and exhibiting a high operation speed.

Another object of the present invention is to provide an assembly of a film carrier of the foregoing type and a semiconductor chip and a method of manufacturing the assembly.

Another object of the present invention is to provide a semiconductor device using a metal lead-film carrier assembly of the foregoing type and a method of manufacturing the device.

According to one aspect of the present invention, there is provided a film carrier-semiconductor chip assembly comprising: a film carrier for supporting metal leads; and a semiconductor chip having electrodes electrically and mechanically connected to the metal leads, wherein the film carrier includes a plurality of film layers each having at least one group of metal leads mounted on a surface thereof, and the film layers are so stacked that the metal leads of the metal lead groups of the film layers do not contact and do not cross one another.

According to an embodiment of the assembly of the present invention, ends of the metal leads connected to the electrodes of the semiconductor chip are disposed in substantially the same plane.

The method of manufacturing the semiconductor chip-film carrier assembly comprises the steps of: bonding a first group of metal leads on one film carrier to some bumps on the semiconductor chip; and bonding a second group of metal leads on another film carrier to the other bumps of the semiconductor chip. In a preferred embodiment of the method, the metal leads of the first group are bonded to a first group of bumps comprising at least every other bumps on the semiconductor chip and the metal leads of the second group are bonded to a second group of bumps present among the bumps of the first group.

In an embodiment of the semiconductor chip-film carrier assembly, each film carrier has a plurality of stacked film layers each having a group of metal leads, the film layers have aligned device-holes, and the metal leads of the film layers extend crossing the aligned device-holes. This structure enables the leads to be handled in a state where the two ends of fine metal leads are mechanically held by the film carrier. Therefore, an advantage can be obtained that errors in the positioning of the leads, undesirable bending of the leads and assembling errors due to the deviation of the pitch of the leads can be prevented at the time of bonding the metal leads to the semiconductor chip, cutting and forming the leads and bonding the leads to the wiring substrate.

In a preferred embodiment of the semiconductor chip-film carrier assembly, each metal lead has a portion extending across the device-hole and a cut is formed in at least a part of the extending portion. This structure facilitates the positioning of the metal leads to the electrodes of the semiconductor chip as well as the cutting of unnecessary portions of the leads after they have been bonded.

In a further preferred embodiment of the semiconductor chip-film carrier assembly, the film carrier has testing wiring electrodes and metal leads electrically connected to the testing wiring electrodes. In this embodiment, the film carrier has a first film layer including the testing wiring electrodes on a surface thereof and a second film layer stacked on the first film layer and including metal leads electrically connected to the semiconductor chip, the metal leads being electrically connected to the testing wiring electrodes. This structure enables an electrical test of the semiconductor chip to be mounted on the tape carrier to be easily performed.

According to the present invention, there is provided a method of manufacturing a film carrier-semiconductor chip assembly of the type that comprises a film carrier having a device-hole formed therein and metal leads mounted thereon, and a semiconductor chip having, formed along a periphery thereof, bumps electrically connected to the metal leads, the method comprising the steps of: positioning the semiconductor chip with respect to the device-hole in the film carrier; aligning a first portion of each metal lead adjacent an end of each metal lead on the film carrier with one of the bumps on the semiconductor chip; bonding together the thus aligned bumps and the metal leads; and forming a second portion of each metal lead adjacent to the other end of the metal lead into a shape adaptable to the structure of another electric element to which the film carrier-semiconductor chip assembly is attached.

According to another aspect of the present invention, there is provided a semiconductor device comprising: a first wiring substrate; a second wiring substrate mounted on the first wiring substrate; and at least one semiconductor chip mounted on the second wiring substrate, wherein a first group of electrodes on the first wiring substrate is connected to a second group of electrodes on the second wiring substrate by a plurality of metal leads, the intervals of the electrodes of the first group and the intervals of the electrodes of the second group are substantially the same, and the metal leads connecting the two groups of electrodes extend substantially parallel to each other.

The method of manufacturing the semiconductor device comprises the steps of:
  forming, by etching, a group of metal leads substantially parallel to one another on a film carrier to prepare a metal lead-film carrier assembly;
  mounting the second wiring substrate on the first wiring substrate;
  connecting one ends of the group of metal leads of the assembly to the second group of electrodes;
  positioning the other ends of the group of metal leads to the first group of electrodes while the other end of the group of metal leads are kept mounted on the film carrier; and
  connecting the other ends of the metal leads to the first group of electrodes.

According to a further aspect of the present invention, there is provided a metal lead-film carrier assembly for use to electrically connect a semiconductor device and another electric element, the metal lead-film carrier assembly comprising: a plurality of film layers each having at least one group of metal leads mounted on a surface thereof, the film layers being so stacked that the metal leads of the metal lead groups of the film layers do not contact and do not cross one another, and the film layers being bonded together by adhesive.

In a preferred embodiment of the metal lead-film carrier assembly, ends of the metal leads to be connected to the semiconductor device are disposed in substantially the same plane. Therefore, the positioning of the leads to the semiconductor chip and the wiring substrate at the time of bonding of the leads and the connection process following the positioning can be facilitated. Therefore, the electrodes can easily be formed on the semiconductor chip.

The above and other objects, features and advantages of the present invention will become more apparent from the following description with reference to the accompanying drawings.

BRIEF DESCRIPTION OF THE DRAWINGS

FIG. 1A is a fragmentary top view which illustrates a semiconductor chip-film carrier assembly according to an embodiment of the present invention;

FIG. 1B is a cross-sectional view taken along line IB—IB in FIG. 1A;

FIGS. 6A-1 to 6C-2 are schematic views which illustrate the steps of connecting the metal leads when the semiconductor device shown in FIG. 5 is manufactured, wherein FIGS. 6A-2, 6B-2 and 6C-2 are cross-sectional views respectively taken along lines VIA-2—VIA-2, VIB-2—VIB-2 and VIC-2—VIC-2 in FIGS. 6A-1, 6B-1 and 6C-1;

FIGS. 7A-1 to 7E-2 are schematic views which illustrate the steps of another method for reducing the connection pitch of the metal leads, wherein FIGS. 7A-2, 7B-2, 7C-2, 7D-2 and 7E-2 are side views which respectively illustrate the assembly of the semiconductor substrate and the film carrier shown in FIGS. 7A-1, 7B-1, 7C-1, 7D-1 and 7E-1;

DESCRIPTION OF PREFERRED EMBODIMENTS

Figure 2A:
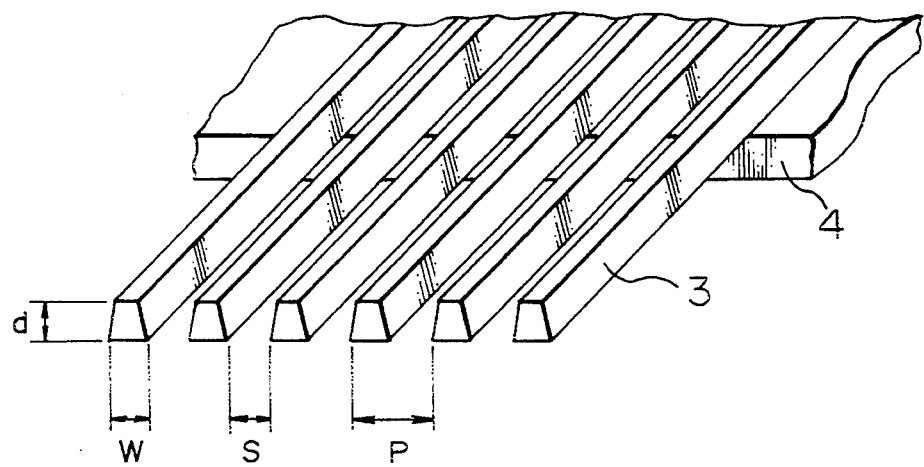
FIG. 2A is a perspective view which illustrates one film carrier layer included by the film carrier shown in FIGS. 1A and 1B and metal leads disposed on the film carrier layer.

Referring to FIGS. 1A and 1B, a semiconductor chip 1 is electrically connected by Au-bumps 2 to metal leads 3 projecting from a polyimide film carrier 4 into a device-hole 6. The metal leads 3 are composed of a first metal lead group 3a and a second metal lead group 3b which are respectively and previously formed on a first layer 4a and a second layer 4b of the film carrier 4, the layers 4a and 4b being bonded to each other by adhesive 10.

The semiconductor device is, for example, manufactured as follows.

The metal leads 3b on the film forming the second layer 4b are disposed among the metal leads 3a formed on the film forming the first layer 4a by adjusting the positions of the two film layers 4a and 4b. Then, the two layers are bonded to each other with the adhesive 10, so that the film carrier 4 is made. The shape and the dimensions of the metal leads 3 projecting from the film are determined at the time of manufacturing the film carrier 4. That is, the basic dimensions of the metal leads of the film carrier are determined depending upon the performance of the semiconductor chip 1 to be mounted, the number of electrodes to be connected and the configuration of the electrodes. If a high-speed semiconductor chip that consumes large electric energy is mounted, sufficient thickness is selected for the group of metal leads on each film layer, and a plurality of the film layers are stacked up. Thus, the pitch of the leads on the thus manufactured film carrier is effectively shortened. Then, the positions of the tips of the metal leads in the foregoing groups and the positions of the bumps on the semiconductor chip are adjusted, and then they are bonded together by a thermo-compression method. In this embodiment, the metal leads 3 are applied with Sn-plating and the metal leads 3 are connected to the bumps by an AuSn-eutectic joining method. The surfaces of the metal leads 3 may alternatively be applied with Au-plating, so that the leads and the electrodes can be joined together by ultra-sonic bonding. Although FIG. 1B illustrates an arrangement that the film 4a forming the first layer and the film 4b forming the second layer are bonded such that the surfaces of the films carrying the leads 3a and 3b face each other, the reverse side of the film 4b forming the second layer may simply be stacked on the surfaces of the metal leads on the film 4a forming the first layer. Although a vertical level difference of the tips of the leads projecting from the two film layers takes place in this case, the tips of the leads may be shaped to make the heights of the leads at the connection portion to be the same.

FIG. 2A illustrates the basic structure of a tape carrier made by an etching method, FIG. 2A schematically illustrating the metal lead group projecting into a device-hole. First, a metal such as Cu, which can relatively easily be etched, is formed into foil by rolling, the metal foil being then stacked upon a polyimide tape carrier 4 by making use of adhesive so that a laminated structure is formed. A predetermined lead pattern is formed on the Cu foil by a photolithography process and then the laminated structure is immersed in a Cu-etching solution so that metal leads 3 each having a predetermined size are formed on the tape carrier 4. Since etching proceeds in the lateral direction (widthwise direction) of each lead during the etching process, the cross section of each metal lead 3 is formed into a mesa shape as illustrated. Referring to FIG. 2A, lead pitch P is expressed by the sum of lead width W and lead interval S. Thus, the lead thickness d must therefore be thinned in proportion to the decrease in the lead pitch P. That is, since etching-factor (EF=d'/ΔS) defined by etching amount ΔS in the lateral direction of the lead and etching depth d' (>d) is, in general, decreased in proportion to decrease in the width S' (=S+2ΔS) of an opening at the time of etching, penetrating etching cannot be performed if the metal foil is too thick with respect to the opening width.

Figure 2B:
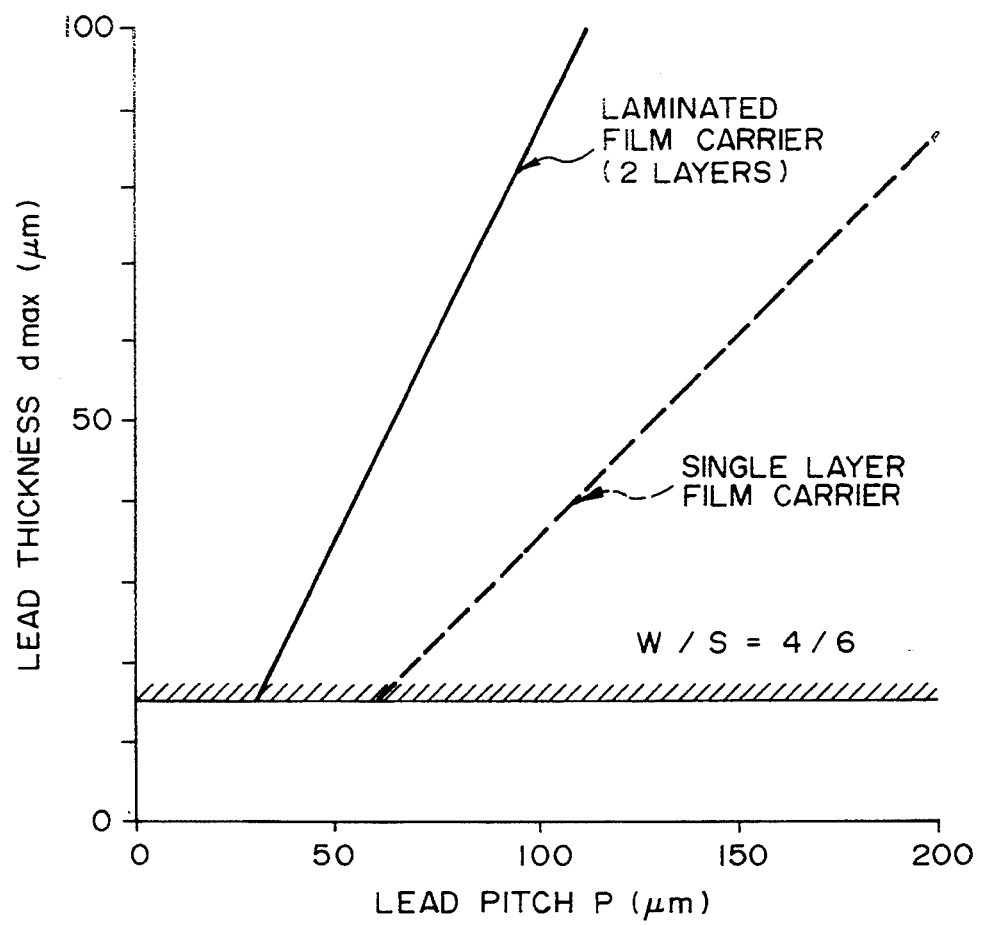
FIG. 2B is a graph showing the relationship between the thickness of the metal leads on a film carrier and the lead pitch.

FIG. 2B is a graph which illustrates the relationship between the lead pitch P obtained by the described etching process and the maximum lead thickness dmax that can be worked. A dashed line in this graph shows the relationship obtained in a case where the ratio of the lead width and the lead gap is made to be 4:6 (W/S=4/6). Because of the foregoing reason, dmax decreases with an increase in W/S. Since the process for rolling a metal material causes the density of defects in a metal structure to be increased with a decrease in the thickness of the metal film, the satisfactory reproducibility of a pattern by etching and strength of the metal leads 3 after the process has been performed cannot easily be assured (designated by a region of the graph where the lead thickness is 15 μm or thinner).

Therefore, a single-layer film carrier involves decrease in the lead thickness that can be obtained, due to narrowing of the lead pitch. Further, fine leads having excellent characteristics cannot be obtained in a narrow pitch region in which the pitch is 50 to 60 μm or shorter.

On the other hand, the appreciation of pins and the high speed operation of the semiconductor chip raises a demand for an appreciation of pins and rise of the aspect ratio of the tape carrier lead. The decrease in the lead thickness causes the lead resistance and self and mutual inductances to be increased, resulting in critical problems in the supply of large energy by way of leads and in a high-speed signal transmission. Accordingly, a desired thickness of the lead is maintained in advance on each film layer and such film layers are then stacked up as shown in FIG. 1B so as to effectively shorten the lead pitch. That is, the two single-layer film carriers are stacked up as designated by a solid line shown in FIG. 2B so that the lead pitch can be halved if the maximum lead thickness, that can be obtained, is the same.

FIGS. 3A to 3D illustrate some examples of the structure according to the present invention in each of which tape carriers are stacked up. Although FIGS. 3A to 3D illustrate the two-layer structures, the number of the layers may be increased to correspond to the W/S ratio of the film carrier of each layer.

Figure 3A:
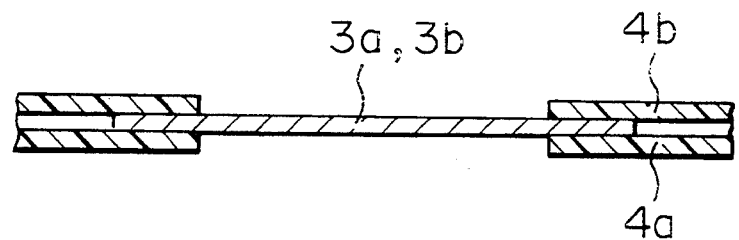
FIGS. 3A to 3D are cross-sectional views which respectively illustrate different examples of stacked structures of the film carriers for use in the semiconductor chip-film carrier assembly shown in FIG. 1A.
Figure 3B:
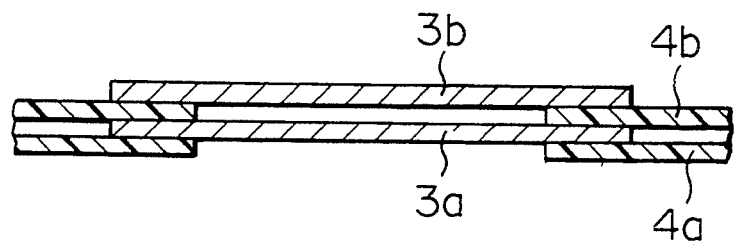
Figure 3C:
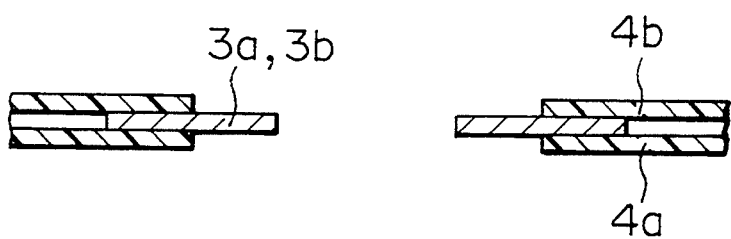
Figure 3D:
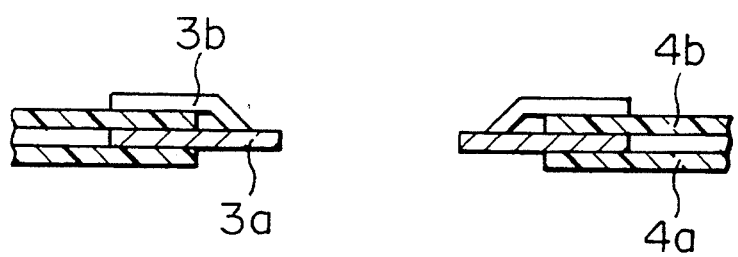

Referring to FIGS. 3A to 3D, reference numeral 3a represents a metal lead of a first group, and 3b represents a metal lead of a second group, each of the metal leads 3b being disposed in a lead gap between a pair of adjacent metal leads 3a. In FIGS. 3A and 3C, the metal lead 3b of the second group is hidden by the metal lead 3a. The film 4a of the first layer and the film 4b of the second layer are bonded to each other. FIG. 3A illustrates an example in which the film 4a of the first layer and the film 4b of the second layer are stacked up such that their surface on which the leads are disposed face each other. FIG. 3B illustrates a cross-sectional structure in which the first layer 4a and the second layer 4b are stacked up such that their lead supporting surfaces are directed upwards. If satisfactory strength of the metal leads 3 can be obtained, the two layers may be stacked up such that the tips of the connection portions of leads are made to be free ends, as shown in FIGS. 3C and 3D. If a vertical level difference takes place between the metal leads 3a and 3b on the two stacked films, as shown in FIG. 3D, it is preferable that the tips of the metal leads 3b are, for example, formed to be positioned on the plane on which the tips of the metal leads 3a are positioned so as to easily connect a semiconductor chip and the leads together. Although omitted from illustration, forming of a recess in the central portion of the metal lead 3b enables the lead connection surfaces to be positioned at the same height even in a case where the structure shown in FIG. 3B is employed.

Figure 4:
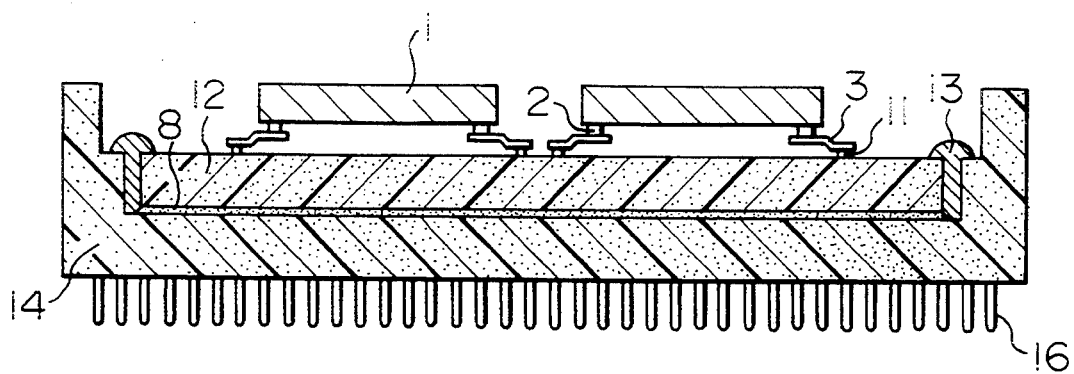
FIG. 4 is a cross-sectional view which illustrates an embodiment of a semiconductor device using the semiconductor chip-film carrier assembly shown in FIGS. 1A and 1B.

FIG. 4 illustrates the cross section of a semiconductor device manufactured by using the tape carrier according to this embodiment. Referring to FIG. 4, each semiconductor chip 1 is electrically connected to an end of a metal lead 3 by an Au-bump 2. The other end of the metal lead 3 is connected to a wiring board 12 by an Au-electrode 11. Electric lines in the wiring board 12 are electrically connected, by bonding wires 13, to a wiring layer in a base substrate 14 of a semiconductor package. Further, the wiring layer in the package base substrate 14 is connected to external terminals 16.

The semiconductor device of the described structure is, for example, manufactured as follows.

First, the positions of the metal leads 3 of the tape carrier in the form of the stacked structure as shown in FIG. 3C are adjusted to be aligned with the bumps 2 on each semiconductor chip 1 and then the metal leads 3 and the bumps 2 are bonded to one another. Then, the metal leads 3 are subjected to the forming process and then their outer ends are cut to have predetermined lengths. The positions of the lead terminals of the semiconductor chip thus obtained are adjusted to be aligned with the electrodes 11 on the wiring board 12 and then they are bonded to each other. Then, the wiring board 12 is bonded to the base substrate 14 by a Si-type adhesive 8.

In this embodiment, Cu is employed as the material of the metal leads 3, Ni-plating is applied to the Cu-surface and Au-plating is applied to the Ni-surface. Since Au is also employed to form the electrode 11 of the opposing substrate 12, supersonic bonding is performed to sequentially connect the metal leads 3, the electrodes 2 and 11. However, Pb—Sn solder may be employed as the material of the electrodes. By applying Pb—Sn or Sn-plating to the surfaces of the metal leads 3, the leads can be connected by thermo-compression bonding.

In this embodiment, the maximum width of the metal leads 3 on a single film layer is made to be 50 μm, the minimum width of the same is made to be 30 μm, the maximum gap between adjacent metal leads 3 is made to be 90 μm, the minimum gap of the same is made to be 70 μm and the thickness of the metal leads 3 is made to be 35 μm. In this case, the lead pitch is about 120 μm. Two such film layers are stacked up such that their lead-carrying surfaces face each other, so that a film carrier having a lead pitch shortened to about 60 μm is realized. If a film carrier having the same lead width and the same lead pitch is realized on a single-layer-film, the thickness of the metal leads 3 cannot easily be made to be 20 μm or more as can be understood from FIG. 2B.

Since this embodiment enables the lead pitch to be shortened by mutually stacking up two films supporting leads as described above, the appreciation of the pins of the film carrier can be realized while eliminating the necessity for thinning the lead thickness.

Although the metal leads 3 are made of Cu in this embodiment, metal leads made of Cu—Zr alloy or Ni, Au or SUS alloy may be used to obtain similar effects.

Figure 5:
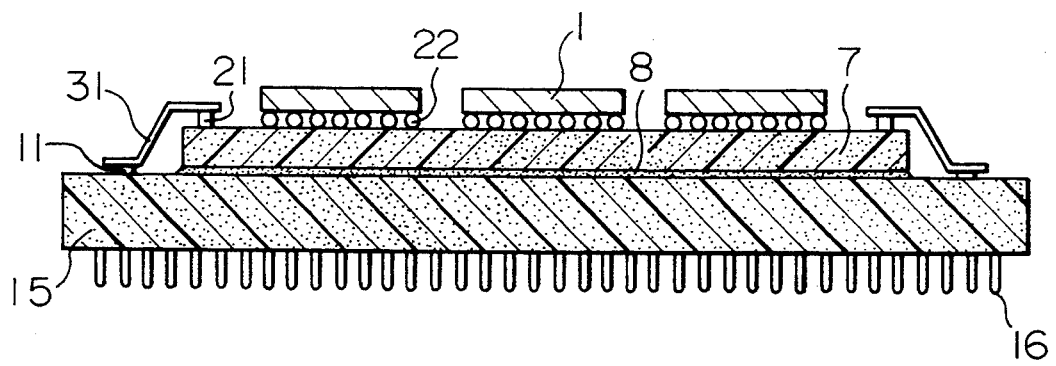
FIG. 5 is a cross-sectional view which illustrates a second embodiment of the semiconductor device according to the present invention.

FIG. 5 illustrates the cross sectional structure of a semiconductor device according to a second embodiment of the present invention.

A semiconductor device shown in FIG. 5 is so constructed that a plurality of semiconductor chips 1 are mounted on a semiconductor substrate 7 made of, for example, Si. Further, the semiconductor substrate 7 is mounted on a wiring board 15 made of, for example, mullite. Each semiconductor chip 1 is electrically and mechanically connected to the semiconductor substrate 7 by solder bumps 22, the semiconductor substrate 7 having active devices which are formed thereon and which constitute a network or the like for establishing the connections between the semiconductor chips 1. The semiconductor substrate 7 is bonded to a wiring board 15 by a Si-type adhesive 8, the semiconductor substrate 7 and the wiring board 15 being electrically connected to each other by metal leads 31 by way of Au-bumps 21 formed on the semiconductor substrate 7 and Au-electrodes 11 formed on the wiring board 15.

The semiconductor device thus described is manufactured as follows.

First, the positions of the plurality of semiconductor chips 1 are adjusted on the semiconductor substrate 7 and they are connected together by reflow bonding. Then, the ends of the metal leads 31 formed on the tape carrier by an etching method are connected to the Au bumps 21 formed on the semiconductor substrate 7. Then, the semiconductor substrate 7 is bonded to the surface of the mullite wiring board 15 by a Si-type adhesive 8. Further, the other ends of the metal leads 31 are connected to the Au-electrodes 11 formed on the wiring board 15.

Figures 1, 6A:
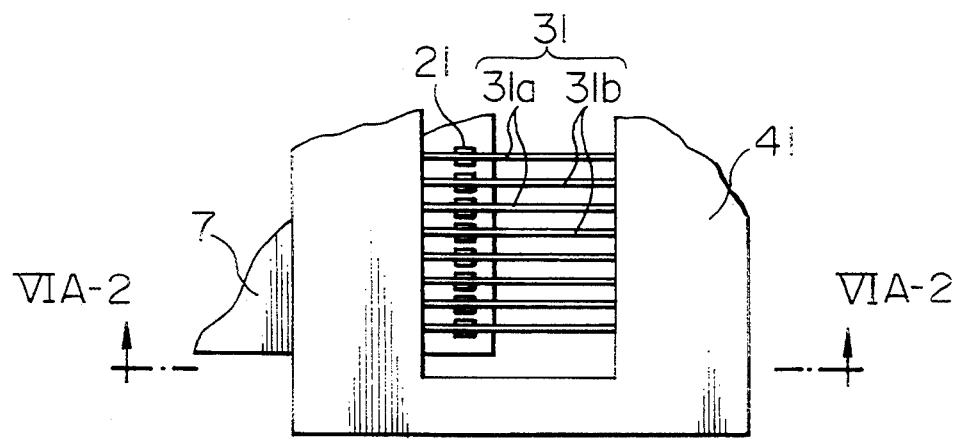
Figures 2, 6A:
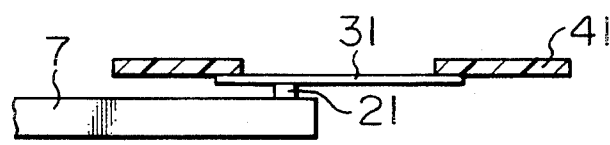
Figures 1, 6B:
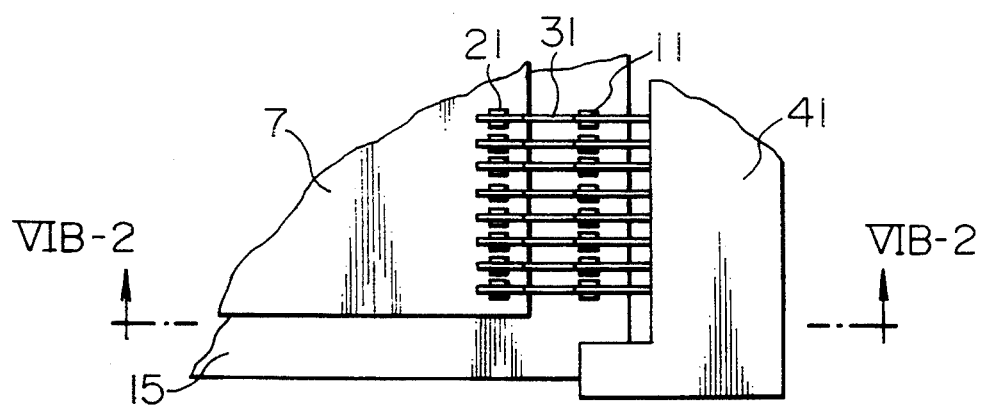
Figures 2, 6B:
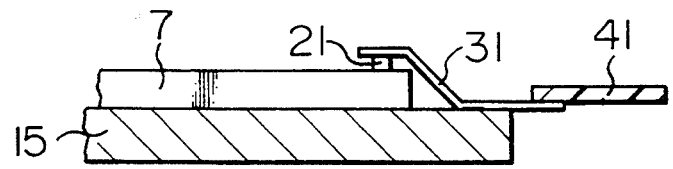
Figures 1, 6C:
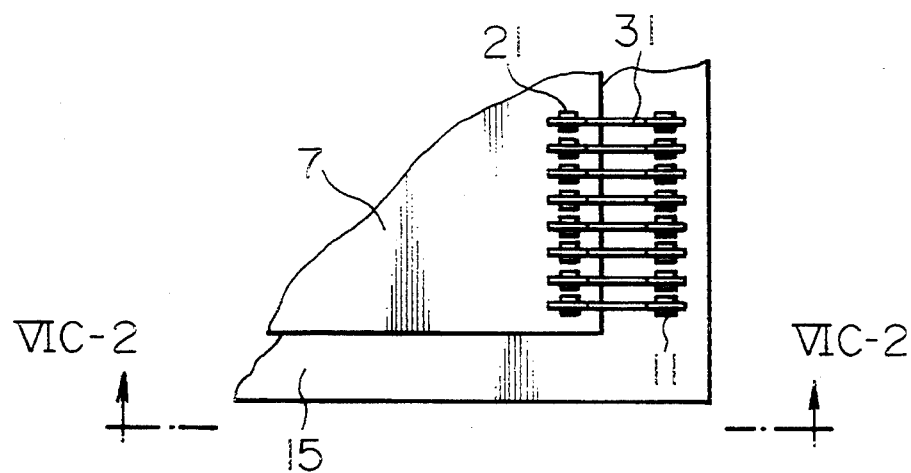
Figures 2, 6C:
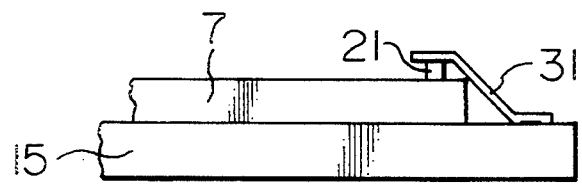

FIGS. 6A to 6C illustrate the procedure of connecting the semiconductor substrate 7 and the wiring board 15 to each other by the metal leads 31.

While maintaining the state where the two ends of each metal lead 31 are fixed to the upper surface of a polyimide-film 41 as shown in FIGS. 6A-1 and 6A-2, the Au-bumps 21 formed on the semiconductor substrate 7 and portions of the metal leads 31 adjacent one ends thereof are first bonded and connected to one another. Then, unnecessary portions of the ends of the metal leads 31 extending along the upper surface of the semiconductor substrate 7 and of the film 41 are cut as shown in FIGS. 6B-1 and 6B-2. Then, the metal leads 31 are subjected to a forming process so as to be adaptable to the positions of the connection electrodes 11 on the wiring substrate 15. Then, the positions of other ends of the metal leads 31 kept fixed to the upper surface of the film 41 are adjusted to be aligned with the Au-electrodes 11 on the wiring board 15 and then the metal leads 31 and the electrodes 11 are bonded one another. Finally, residual portions of the metal leads 31 on the wiring board 15 and of the film 41 are removed by cutting so that a connection structure shown in FIGS. 6C-1 and 6C-2 is obtained. Although the connections of the metal leads 31 to the electrodes 21 formed on the semiconductor substrate 7 are sequentially established in this embodiment, the ends of the metal leads 31 on the semiconductor substrate 7 may be previously cut if the metal leads 31 are collectively bonded to all the electrodes along the four sides of the substrate 7. Although the bonding method is the same as the inner lead bonding employed in a general TAB connection, the outer leads are bonded while maintaining the state where these ends of the leads are fixed to the film.

In this embodiment, a tape carrier formed into a stacked structure according to the first embodiment may be employed in order to appreciate the terminals of the leads. The material of the metal leads, the material for metallizing the surfaces of the metal leads and the material of the connection electrodes may be the materials used according to the first embodiment. Therefore, the lead connection process may be performed by the ultra-sonic, thermo-compression bonding or soldering melting connection. However, a method, such as single-point TAB, of a type in which bonding is performed partially is preferable to collective bonding.

Since this embodiment is so conducted that the two ends of each metal lead are fixed to the film carrier at the time of connecting the metal lead, deformation of the metal leads and partial deviation of the pitch occurring at the time of handling them can be prevented. As a result, the position adjustment of the leads can easily be performed at the time of the assembly and the defective connections of the metal leads can significantly be prevented.

FIGS. 7A-1 to 7E-2 illustrate another method of shortening the connection pitch of the metal leads at the time of connecting the leads according to the second embodiment.

Figures 1, 7A:
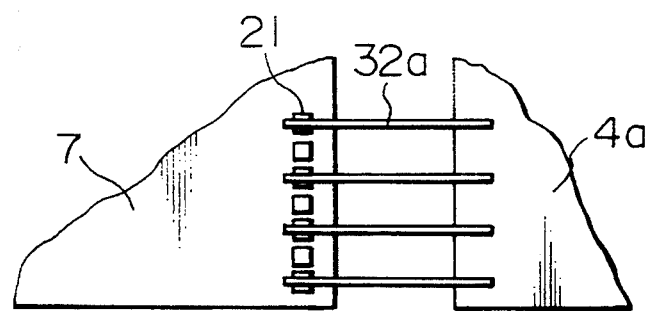
Figures 2, 7A:
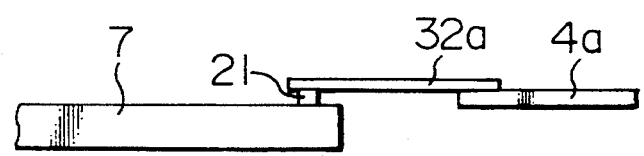
Figures 1, 7B:
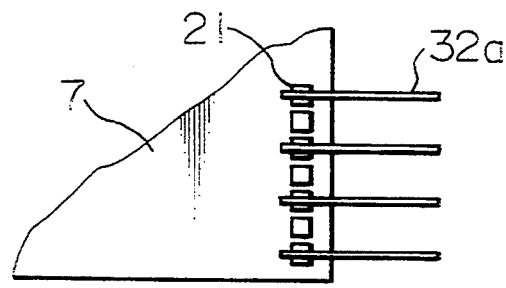
Figures 2, 7B:
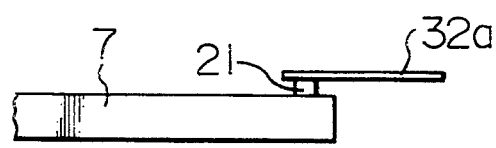
Figures 1, 7C:
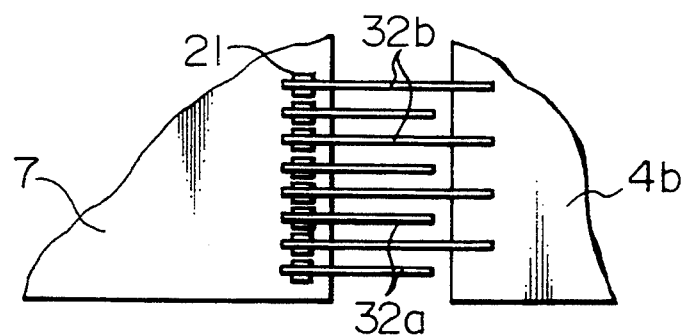
Figures 2, 7C:
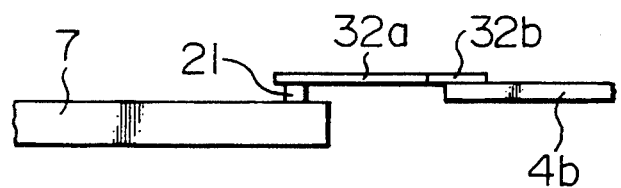
Figures 1, 7D:
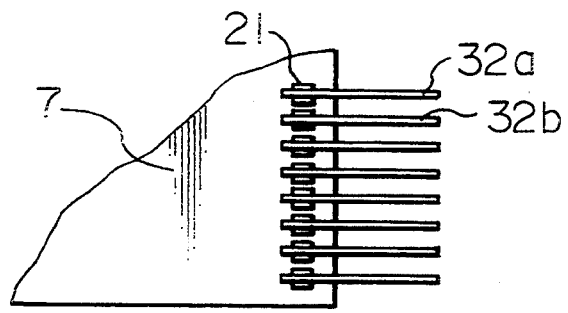
Figures 2, 7D:
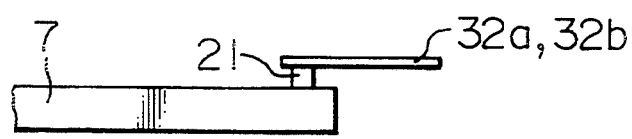

First, every other bumps of the Au bumps 21 on the semiconductor substrate 7 and the metal leads 32a formed on the first film carrier 4a are connected to one another as shown in FIGS. 7A-1 and 7A-2. Then, the outer ends of the metal leads 32a are cut as shown in FIGS. 7B-1 and 7B-2, and then the metal leads 32b formed on the second film carrier 4b are each disposed between adjacent metal leads 32a and then connected to the residual Au-bumps 21 (see FIGS. 7C-1 and 7C-2). Then, the metal leads 32b are cut to have the same lengths as those of the metal leads 32a as shown in FIGS. 7D-1 and 7D-2. Assuming that the lead pitch on the first film carrier 4a and that on the second film carrier 4b are the same, the lead pitch obtained after the metal leads 32a and 32b are connected to the Au-bumps 21 on the semiconductor substrate 7 (in a state as shown in FIGS. 7D-1 and 7D-2) is one half of the lead pitch in each film carrier.

Figures 1, 7E:
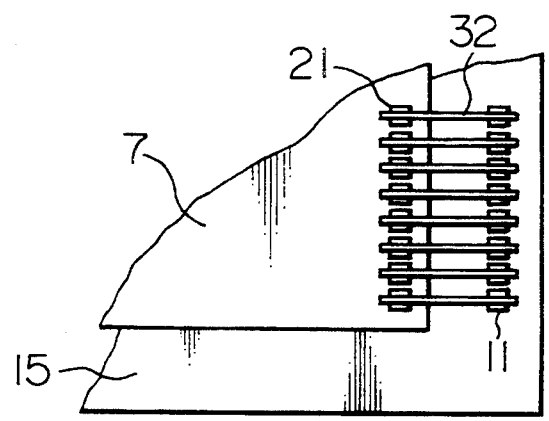
Figures 2, 7E:
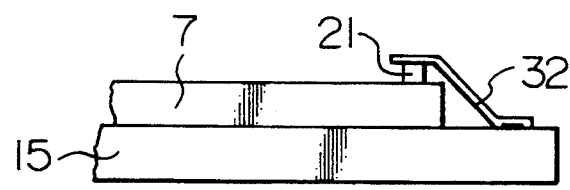

Finally, the semiconductor substrate 7, to which the leads 32a and 32b are connected as described above, is mounted on the wiring board 15 and the metal leads 32a and 32b are connected to the Au-electrodes 11 on the wiring board 15 (see FIGS. 7E-1 and 7E-2).

Also, in this embodiment, the leads may be connected to the substrates 7 and 15 in a state where both film carriers 4a and 4b are mutually stacked up in place of previously cutting the ends of the metal leads on the film carriers. The connections of the leads may be performed in this case in accordance with the method described with reference to FIGS. 6A-1 to 6C-2.

Figure 8:
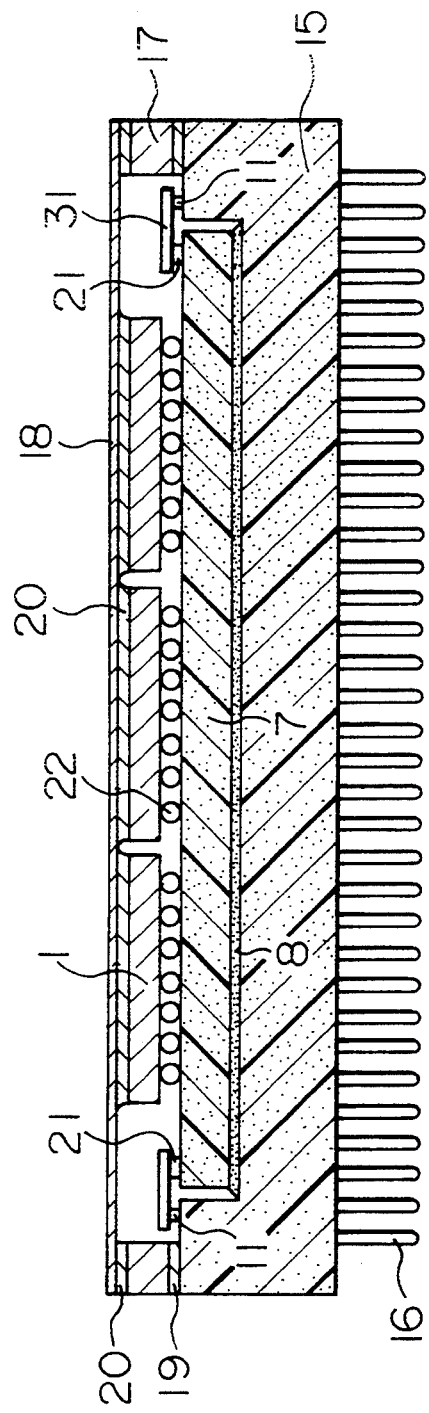
FIG. 8 is a cross-sectional view which illustrates a third embodiment of the semiconductor device according to the present invention.

FIG. 8 illustrates the cross-sectional structure of a semiconductor device according to a third embodiment of the present invention.

Since the basic structure shown in FIG. 8 and comprising the semiconductor chips 1, the semiconductor substrate 7 including the active circuits and the mullite wiring board 15 is similar to that of the second embodiment, the same reference numerals are given to the same elements shown in FIG. 5 and their descriptions are omitted here.

In this embodiment, the heights of the connection surfaces of the Au-bumps 21 formed on the semiconductor substrate 7 and those of the Au-electrodes 11 formed on the wiring board 15 are made to be substantially the same (a periphery 15' of the substrate 15 projects over the thickness of the substrate 7), and the electrodes 11 and 21 are connected in a state where the metal leads 31 are not bent. Further, a supporting frame 17 made of, for example, kovar is mounted on the upper surface of the periphery of the wiring board 15 serving as the base substrate of the package. Then, the lower surface of the supporting frame 17 is connected to the wiring board 15, and the upper surface of the same is connected to a covering plate 18 by soldering materials 19 and 20 respectively so that the semiconductor chip 1 is sealed up.

The semiconductor device is, for example, manufactured as follows:

The plurality of semiconductor chips 1 are bonded to the semiconductor substrate 7 in a face-down manner and the positions of the Au-bumps 21 on the semiconductor substrate 7 and those of the Au-electrodes 11 on the wiring board 15 are adjusted. Then, an Si-type adhesive is used to bond the semiconductor substrate 7 and the wiring board 15 to each other. By previously forming a position-adjustment mark on each substrate, the positions of the two substrates can easily be adjusted. Then, the metal leads 31 previously formed on the tape carrier are transferred to the spaces between the electrodes 11 and 21. It is, in this case, preferable that a tape carrier, in which the two ends of the metal leads 31 are bonded to the film as shown in FIGS. 6A-1 to 6C-2, is used. However, a tape carrier having metal leads 31, one ends of which are free ends, may be used.

Then, the leads in the group on the semiconductor substrate 7 are collectively or sequentially connected to the electrodes 21 and then the leads in the group on the wiring board 15 are collectively or sequentially connected to the electrodes 11. If the lengths of the connection portions of the leads are short (i.e., the distance between the Au-bumps 21 on the semiconductor substrate 7 and the electrodes 11 on the wiring board 15 is short), the metal leads 31, the Au-bumps 21 and the electrodes 11 may be connected simultaneously.

Then, the lower surface of the supporting frame 17 is soldered by a Pb-Sn solder 19 to the upper surface of the periphery of the wiring board 15. Finally, a Pb—Sn solder 20 composed differently from the solder 19, is used to solder the covering plate 18 and the reverse side of the semiconductor chip 1 to each other and solder the covering plate 18 and the upper surface of the supporting frame 17 to each other so that a sealed structure is obtained.

In this embodiment, a method similar to the foregoing embodiment may be employed in which one end of each of the metal leads 31 is connected to the Au-bumps 21 of the semiconductor substrate 7, the semiconductor substrate 7 is then mounted and bonded to the wiring board 15 and then the other end of the metal leads 31 is connected to the electrodes 11 on the wiring board 15.

Since this embodiment enables the semiconductor substrate and the wiring board to be connected to each other on the same plane without forming fine metal leads, the connection lengths can be shortened. Further, the pitch of the lead inner ends and the pitch of the lead outer ends are the same, so that a necessity for enlarging the wiring pitch between the Au-bumps 21 on the semi-conductor substrate 7 and the electrodes 11 on the wiring board 15 is eliminated. Therefore, the appreciation of the pins of the package substrate and the size reduction can simultaneously be realized.

Figure 9A:
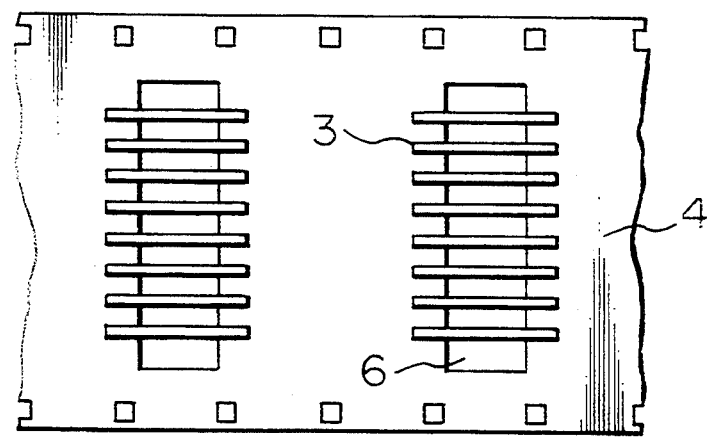
FIGS. 9A, 9B and 9C are partial top views which respectively illustrate different film carriers adaptable to the present invention.
Figure 9B:
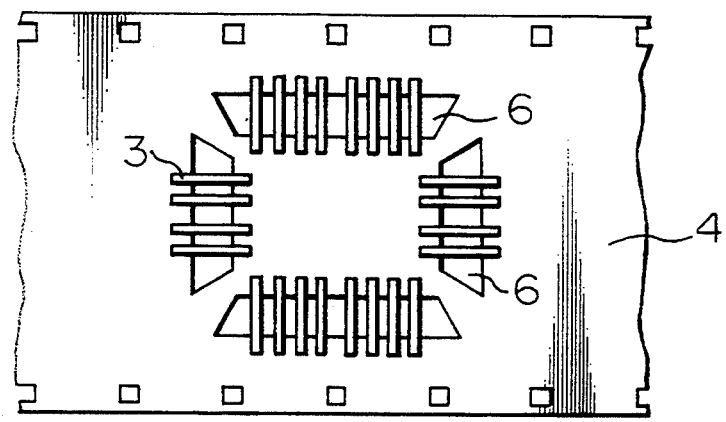
Figure 9C:
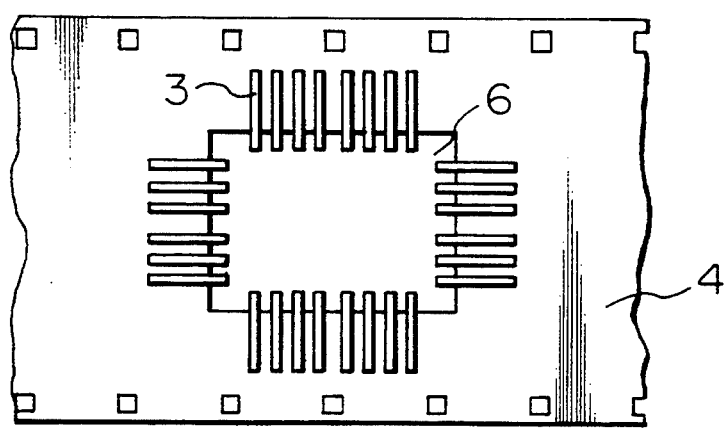

FIGS. 9A to 9C illustrate examples of the pattern of the stacked tape carrier for use in the present invention. In each of the illustrated examples, a device-hole 6 is formed in a single polyimide film 4 and metal leads 3 crossing the device-hole 6 are formed. Although omitted from illustration, a plurality of such films 4 are stacked up, as described above, so that the lead pitch on a resultant film carrier is effectively shortened.

The film carrier 4 shown in FIG. 9A can be used in a case where one side or opposing two sides of a semiconductor chip are collectively connected to leads. Also in the case where leads are partially connected to a large-size substrate such as the semiconductor substrate according to the second or the third embodiment, the film carrier 4 shown in FIG. 9A may be used and bonding may be performed repeatedly by a number required by the size of the substrate. The film carrier 4 shown in FIG. 9B can be used in a case where the positions of the four sides of a semiconductor chip and the positions of all leads are adjusted simultaneously to connect the leads. Although FIG. 9B shows device-holes 6 formed independently on the four sides of a rectangle, the necessity for separately forming the device-holes 6 can be eliminated and they may, therefore, be formed continuously. Although it is preferable that connections of the leads be performed for each side of the semiconductor, the four sides may be collectively bonded by forming a recess in the periphery of the tip of a bonding tool. If the lead has a relatively large cross sectional area and therefore the strength of the lead can be maintained satisfactorily, a lead pattern in which the inner ends of the lead portions are made to be free ends as shown in FIG. 9C may be employed. In this case, collective bonding of the leads can easily be performed as in usual TAB bonding.

If a height difference is generated between the ends of the leads at the time of stacking up the films, the leads are subjected to a forming process as in the first embodiment to make the connection portions thereof to be present in one plane.

Figure 10A:
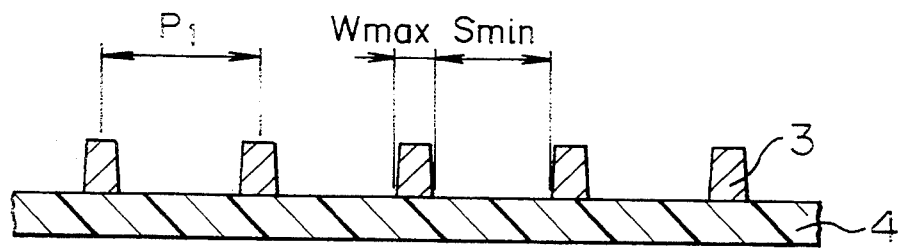
FIGS. 10A, 10B and 10C are enlarged and schematic cross-sectional views which illustrate the film carrier to show the steps of the method of reducing the connection pitch of the metal leads.
Figure 10B:
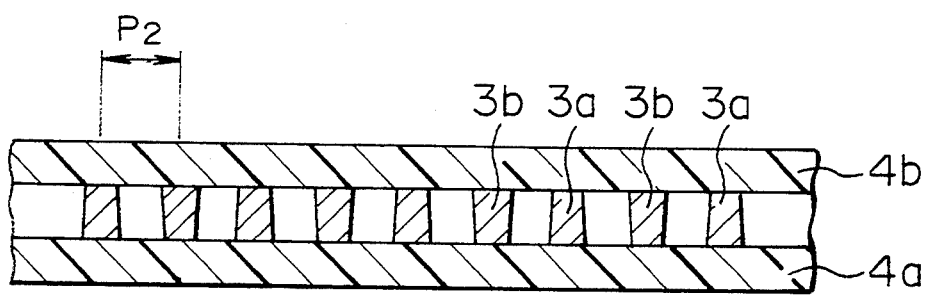
Figure 10C:
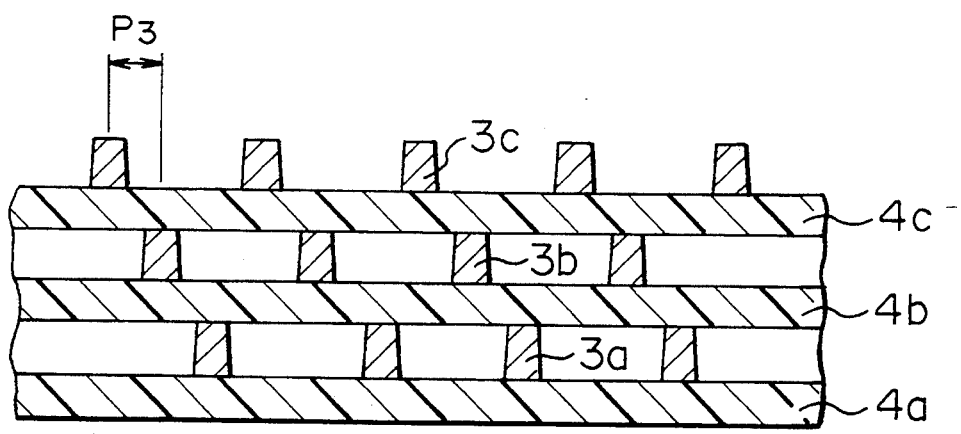

FIGS. 10A to 10C are views which illustrate methods of stacking up a plurality of such film carriers as shown in FIGS. 9A to 9C to shorten the lead pitch.

Maximum lead width Wmax and minimum lead gap Smin of the single film carrier 4 shown in FIG. 10A are determined in accordance with the number of films to be stacked. Assuming that the number of the stacked films is n, the maximum lead width Wmax and the minimum lead gap Smin may be determined to meet a condition expressed by the following expression:

$$W\text{max} \leq (S\text{min} + \Delta g\text{min})/n$$

where $\Delta g$min is the minimum gap between an-adjacent pair of leads after the film carriers 4 have been stacked up.

Since the cross section of the lead is formed into the mesa shape as described above, $\Delta g$min can be made to be larger in the case where two film carriers are stacked up such that the surfaces of the film carriers 4a and 4b, on which the metal leads 3a and 3b are formed, face each other assuming that the ratio Wmax/Smin in each layer to be the same.

FIG. 10C illustrates a structure in which three layers 4a to 4c of film carriers are stacked up so that the lead pitch is made to be one third the lead pitch in each film carrier. In this embodiment, by setting Δgmin ≧ 10 μm, the mutual contacts of the metal leads 3a, 3b and 3c can be prevented in the process of the position adjustments of the leads and the film adhesion process at the time of stacking up the film carriers 4a, 4b and 4c.

Figure 11A:
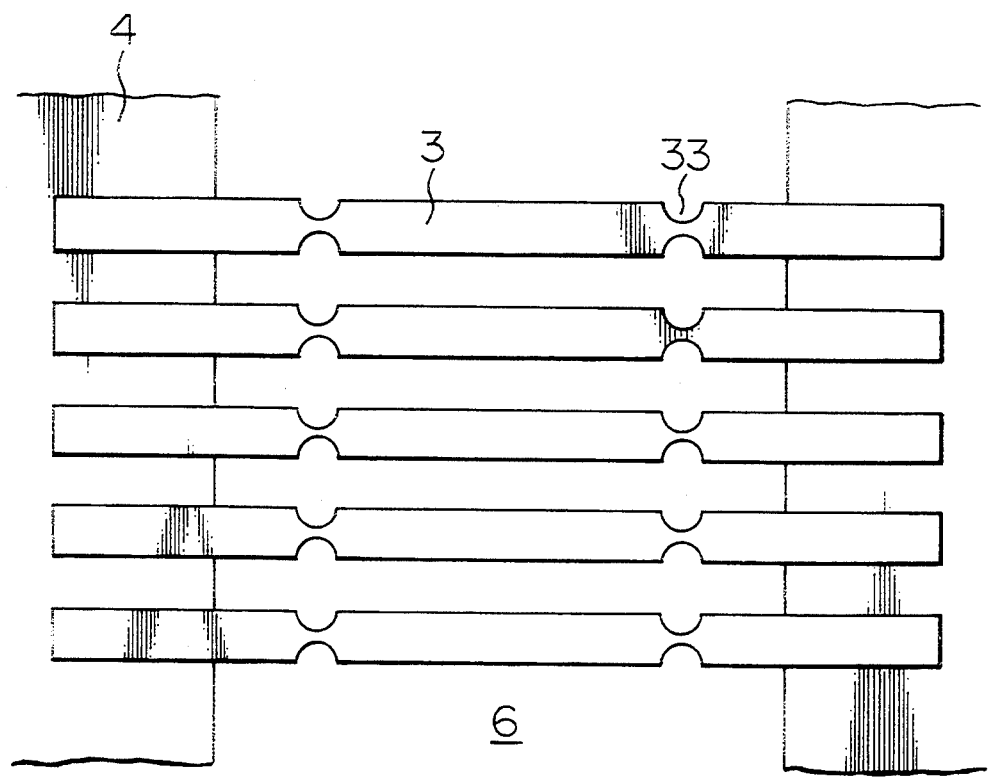
FIGS. 11A and 11B are respectively an enlarged top view and a side view which illustrate a portion of each of the film carriers shown in FIGS. 9A, 9B and 9C.
Figure 11B:
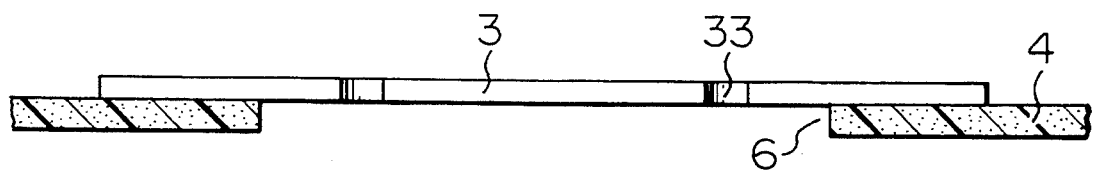

FIGS. 11A and 11B respectively are a top view and an enlarged view of the cross-sectional structure of the tape carrier in which the two ends of each of the metal leads 3 are fixed to a film carrier 4, shown in 9A and 9B.

In this embodiment, notches 33 are formed in respective metal leads 3 disposed on a polyimide film carriers 4. At the time of bonding the leads, the position adjustments thereof to the electrodes are performed by using the notches 33 as position-adjustment marks. Further, unnecessary portions of the metal leads 3 after they have been bonded can easily be cut at the notches. The notches 33 are formed by previously inserting notches into the lead pattern and by performing an etching process. As an alternative to this, the leads may be punched at the notch portions after the leads have been formed by etching to form the notches 33. If the width of each metal lead 3 is narrow, grooves may be formed in the upper surfaces or the side edges of the leads in order to prevent undesirable cutting of the metal leads 3. The structure of the metal leads 3 thus obtained is preferably employed when bonding is performed while maintaining the state where the metal leads are fixed to the film carriers, as in the second embodiment.

As described above, according to this embodiment, selection of a lead pattern adaptable to the shape of the substrate to which the connection is to be established will improve the working efficiency in the bonding process. Further, forming of the notches in the metal leads facilitates the position adjustments at the time of the bonding process and cutting of the leads by bending the leads.

Figure 12:
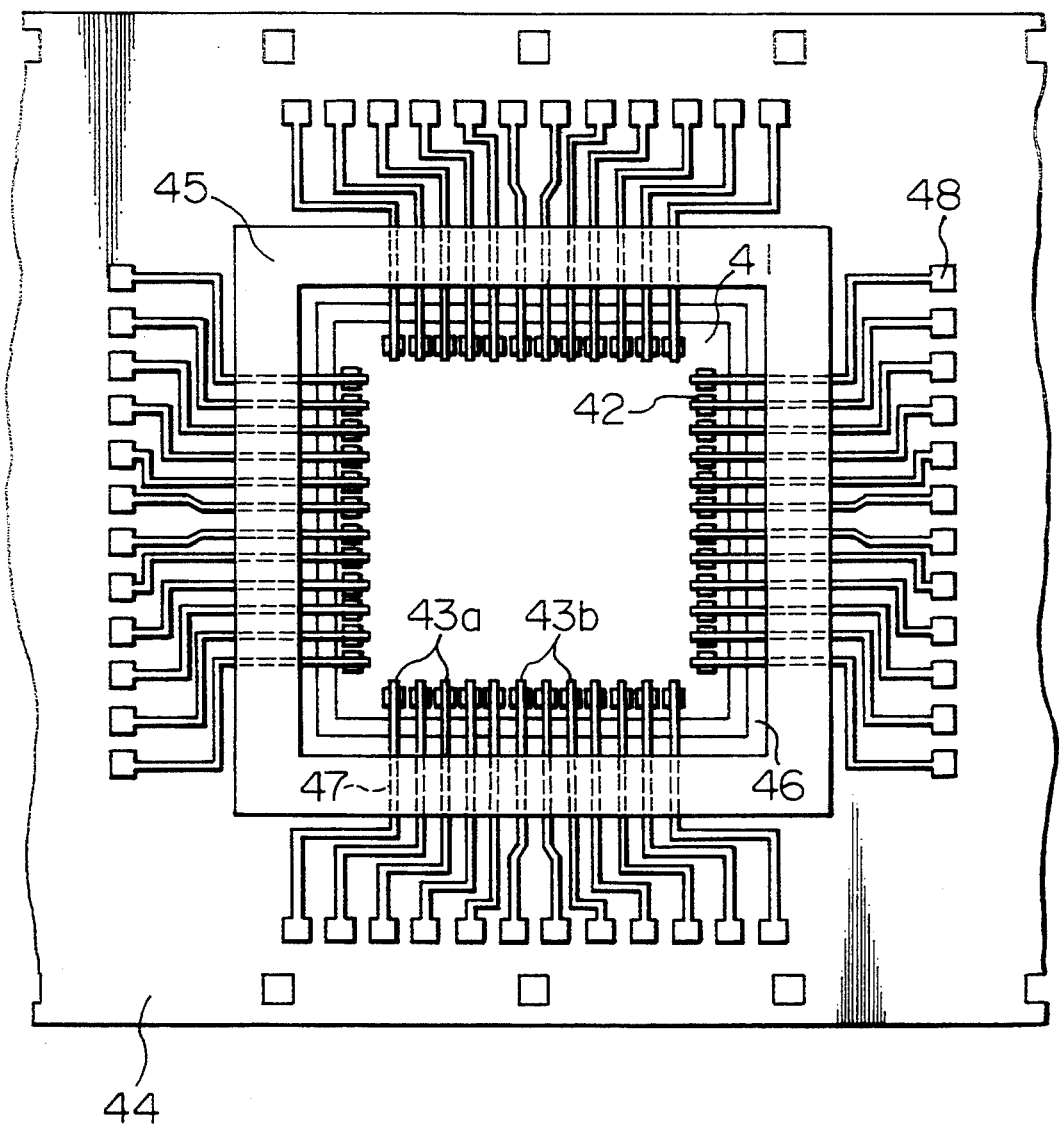
FIG. 12 is a top view which illustrates a fourth embodiment of the semiconductor device according to the present invention.
Figure 13:
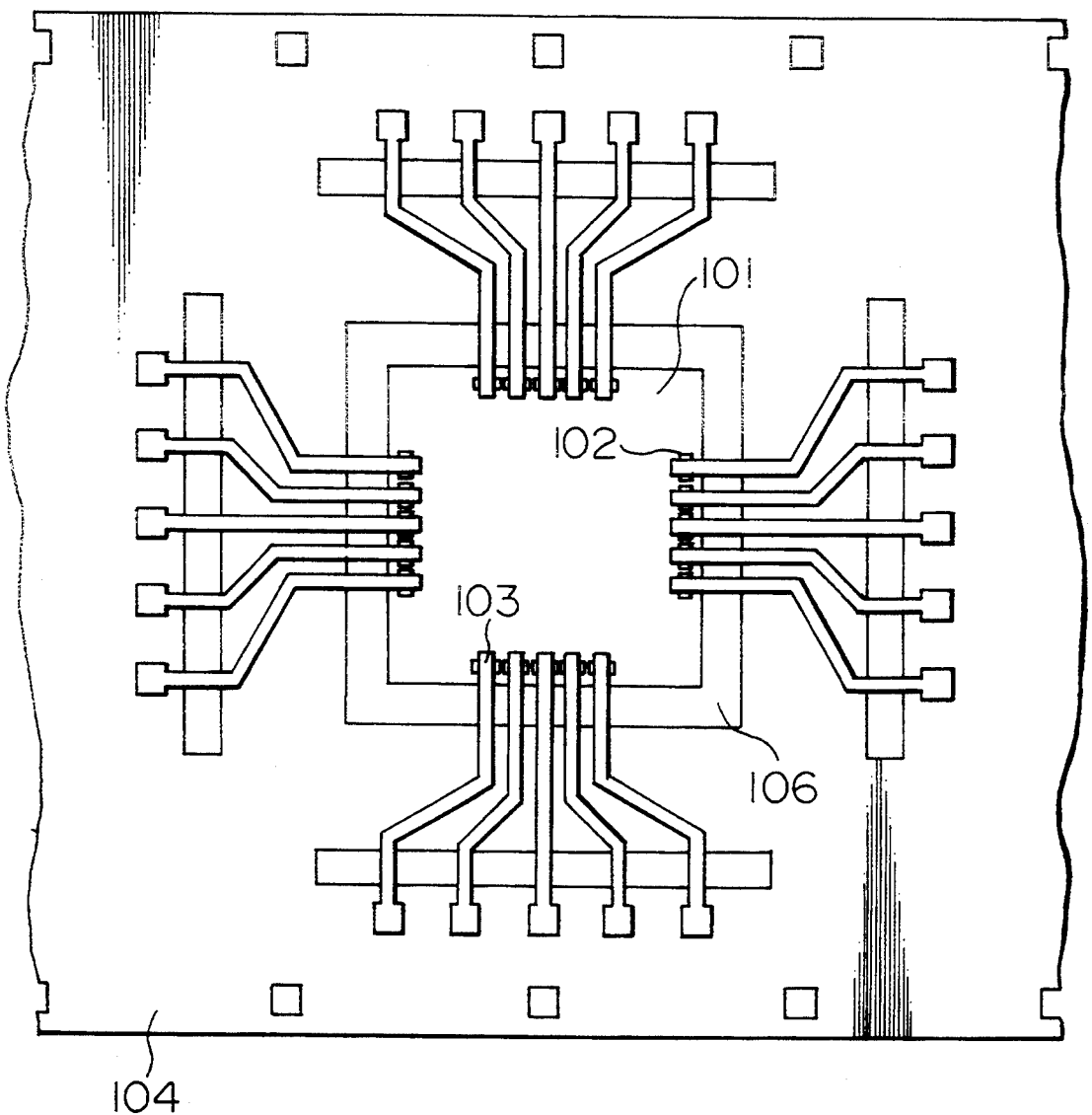
FIG. 13 is a top view which illustrates the conventional semiconductor chip-film carrier assembly.
Figure 14A:
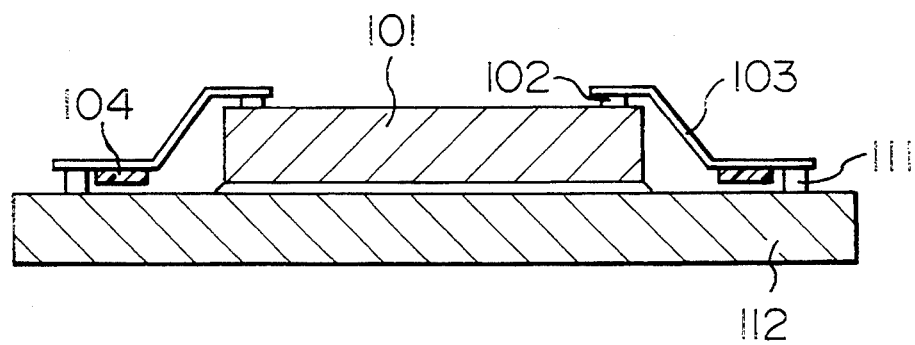
FIGS. 14A and 14B are respectively cross-sectional views which illustrate different semiconductor devices employing the conventional TAB connection.
Figure 14B:
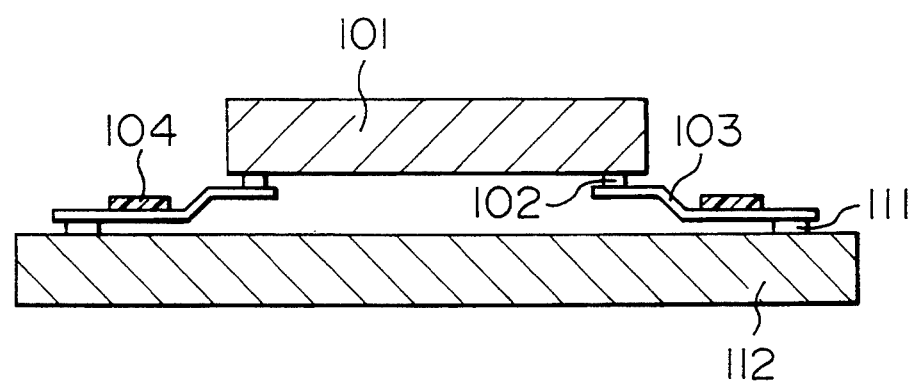

FIG. 12 is a top view of a semiconductor device according to a fourth embodiment of the present invention.

Referring to FIG. 12, reference numeral 44 represents a first film carrier having metal leads 43a projecting into a device-hole 46. A testing wiring layer 47 is formed on the first film carrier 44. The metal leads 43a are electrically connected by the wiring layer 47 to testing pads 48 formed in the outer peripheral portion of the film carrier 44. Reference numeral 45 represents a second film carrier having metal leads 43b. The second film carrier 45 is so disposed that its surface, on which the metal leads 43b are formed, is faced to the first film carrier 44, the metal leads 43b being electrically connected to the wiring layer 47 on the first film carrier 44. Further, the metal leads 43a and 43b are connected to electrodes 42 on a semiconductor chip 41. The inputs and outputs of the semiconductor chip 41 are connected to the testing pads 48 via the wiring layer 47.

The semiconductor device thus obtained is, for example, manufactured as follows.

First, the metal leads 43a and the film carrier 44 having the testing wiring layer 47 on the surface thereof are formed. The film carrier 45 having the metal leads 43b, the pitch of which is the same as that of the metal leads 43a, is stacked on the film carrier 44 thus formed, the two film carriers 44 and 45 being then bonded together. The film carriers 44 and 45 are so positioned at this time that each metal lead 43b is disposed in the gap between an adjacent metal leads 43a so that the lead pitch is effectively shortened. If the metal leads 43a and 43b are not in contact with one another, the lead pitch does not need to be equal. Although the configuration of the leads on the film carrier may arbitrarily be changed to be adaptable to the configuration of the electrodes 42 of the semiconductor chip 41, the metal leads 43b on the second carrier 45 must be so disposed in a pattern that the metal leads 43b can be electrically connected to the wiring layer 47 on the first film carrier 44. The connections between the metal leads 43b on the film carrier 45 and the wiring layer 47 are conducted by use of solder or a conductive adhesive. In order to reinforce the connection, it is preferable to use insulating adhesive to bond the film carriers together.

This embodiment enables appreciation of pins of the film carrier having the testing circuit to be realized while eliminating the necessity for lowering the aspect ratio (the ratio of the width to the thickness of the metal lead) of the metal lead. Therefore, the semiconductor chip which exhibits a higher speed and which is integrated more densely can be mounted on a tape carrier. In particular, an advantageous effect can be obtained when a semiconductor chip in which signals must be transmitted at a high speed and which must be supplied with large electric power is mounted by a TAB manner.

As described above, since the present invention enables the lead pitch to be narrowed while sufficiently maintaining the thickness of each lead on a film carrier, appreciation of pins can be realized while preventing the increase in the number of parasitic devices in the lead connection portions. In particular, a great effect can be obtained when a semiconductor chip in which signals must be transmitted at a high speed and which must be supplied with large electric power is mounted on a film carrier.

What is claimed is:

1. A film carrier-semiconductor chip assembly comprising:
    a film carrier having mounted thereon test wiring electrodes and metal leads electrically connected to said test wiring electrodes; and
    a semiconductor chip electrically connected to said metal leads, wherein
    said film carrier comprises a first film layer with said test wiring electrodes mounted on a surface thereof and a second film layer stacked on said first film layer and carrying said metal leads electrically connected to said semiconductor chip and said test wiring electrodes so as to electrically connect the semiconductor chip and test wiring electrodes.

2. A semiconductor device comprising:
    a first wiring substrate;
    a second wiring substrate mounted on said first wiring substrate; and
    at least one semiconductor chip mounted on said second wiring substrate, wherein
    a first group of electrodes on said first wiring substrate is connected to a second group of electrodes on said second wiring substrate by a plurality of metal leads,
    intervals of the electrodes of said first group and intervals of the electrodes of said second group are substantially the same, and
    the metal leads connecting said two groups of electrodes extend substantially parallel to each other.

3. A semiconductor device according to claim 2, wherein the electrodes of said first group and those of said second group are disposed in planes offset from each other and each of said metal leads is bent to connect two electrodes disposed in the offset planes.

4. A semiconductor device according to claim 2, wherein at least one of said first and second wiring substrates is so shaped that said first and second groups of electrodes are disposed in a substantially the same plane.

5. A film carrier-semiconductor chip assembly, comprising:

a film carrier for supporting metal leads; and a semiconductor chip having electrodes electrically and mechanically connected to said metal leads, wherein said film carrier includes a plurality of film layers each having at least one group of metal leads mounted on a surface thereof, and said film layers are so stacked that the metal leads of said metal lead groups of said film layers do not contact and do not cross one another, and wherein ends of said metal leads connected to said electrodes of said semiconductor chip are disposed in substantially a same plane.

6. A film carrier-semiconductor chip assembly according to claim 5, wherein said film carrier comprises first and second film layers, said first film layer has mounted thereon a first group of metal leads forming test wiring electrodes, and said second film layer has mounted thereon a second group of metal leads for signals.

7. A film carrier-semiconductor chip assembly according to claim 6, wherein said first and second film layers are so stacked that their surfaces on which said metal lead groups are mounted face each other.

8. A semiconductor chip-film carrier assembly, comprising:

a semiconductor chip having bumps along a periphery thereof; and a film carrier carrying thereon groups of metal leads electrically and mechanically connected to said bumps, wherein said film carrier comprises a plurality of stacked film layers each having a group of metal leads, said film layers having aligned device-holes, the metal leads of the respective film layers extending so as to cross said aligned device-holes such that said metal leads do not cross one another in said device-holes, and wherein, when the number of said film layers constituting said film carrier is n, the pitch of said metal leads of said assembly is 1/n of the pitch of said metal leads of each layer.

9. A semiconductor chip-film carrier assembly, comprising:

a semiconductor chip including bumps along a periphery thereof; and a film carrier carrying thereon groups of metal leads electrically and mechanically connected to said bumps, wherein said film carrier has a device-hole formed therein and first and second portions which oppose each other with said device-hole disposed therebetween, and the two ends of each of the metal leads of said metal lead groups are fixed to said first and second portions of said film carrier, and wherein each metal lead has an extending portion extending across said device-hole and a cut is formed at least in a portion of said extending portion.

10. A metal lead-film carrier assembly for use in electrically connecting a semiconductor device and another electric component part, said metal lead-film carrier assembly comprising:

a plurality of film layers each having at least one group of metal leads mounted on a surface thereof, said film layers being so stacked that the metal leads of the metal lead groups of said film layers do not contact and do not cross one another, said film layers being bonded together by adhesive, wherein ends of said metal leads to be connected to said semiconductor device are disposed in substantially a same plane.

11. A metal lead-film carrier assembly for use in electrically connecting a semiconductor device and another electric component part, said metal lead-film carrier assembly comprising:

a plurality of film layers each having at least one group of metal leads mounted on a surface thereof, said film layers being so stacked that the metal leads of the metal lead groups of said film layers do not contact and do not cross one another, said film layers being bonded together by adhesive, wherein said plurality of film layers have aligned device-holes formed therein, the metal leads of each film layer having extending portions extending across said device-holes, and a cut is formed in at least a portion of said extending portions of each metal lead.

12. A metal lead-film carrier assembly for use in electrically connecting a semiconductor device and another electric component part, said metal lead-film carrier assembly comprising:

a plurality of film layers each having at least one group of metal leads mounted on a surface thereof, said film layers being so stacked that the metal leads of the metal lead groups of said film layers do not contact and do not cross one another, said film layers being bonded together by adhesive, wherein said plurality of film layers have aligned device-holes formed therein, the metal leads of each film layer project from the opposing edges of said device-holes, and wherein when the number of said film layers constituting said film carrier is n, the pitch of said metal leads of said assembly is 1/n of the pitch of said metal leads of each film layer.

13. A metal lead-film carrier assembly according to claim 12, wherein said plurality of film layers have aligned device-holes formed therein, the metal leads of each film layer project from the opposite edges of said device-holes, and the tips of said projecting metal leads are positioned in substantially the same plane.

* * * * *